(12) United States Patent
Mu et al.

(10) Patent No.: US 8,873,316 B2
(45) Date of Patent: Oct. 28, 2014

(54) METHODS AND SYSTEMS FOR ADJUSTING NVM CELL BIAS CONDITIONS BASED UPON OPERATING TEMPERATURE TO REDUCE PERFORMANCE DEGRADATION

(75) Inventors: Fuchen Mu, Austin, TX (US); Yanzhuo Wang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 248 days.

(21) Appl. No.: 13/557,481

(22) Filed: Jul. 25, 2012

(65) Prior Publication Data
US 2014/0029335 A1 Jan. 30, 2014

(51) Int. Cl.
G11C 7/00 (2006.01)

(52) U.S. Cl.
USPC .................. 365/189.16; 365/185.22

(58) Field of Classification Search
USPC ............ 365/189.16, 185.22, 185.29, 201
See application file for complete search history.

(56) References Cited

U.S. PATENT DOCUMENTS

| | | | |
|---|---|---|---|
| 5,991,201 A | 11/1999 | Kuo et al. | 365/185.19 |
| 6,944,077 B2 | 9/2005 | Morikawa | 365/204 |
| 7,079,424 B1 | 7/2006 | Lee et al. | 365/185.29 |
| 7,173,859 B2 | 2/2007 | Hemink | 365/185.28 |
| 7,177,199 B2 | 2/2007 | Chen et al. | 365/185.28 |
| 7,224,617 B2 * | 5/2007 | Takeuchi | 365/185.25 |
| 7,580,288 B2 | 8/2009 | Choy et al. | |
| 7,633,807 B2 | 12/2009 | Chen et al. | |
| 7,715,237 B2 | 5/2010 | Cohen | 365/185.2 |
| 7,733,700 B2 | 6/2010 | Wang | 365/185.18 |
| 7,864,588 B2 | 1/2011 | Betser et al. | 365/185.2 |
| 7,877,542 B2 | 1/2011 | Chow et al. | 711/103 |
| 8,087,787 B2 | 1/2012 | Medin | 353/52 |
| 8,102,713 B2 | 1/2012 | Teggatz et al. | 365/185.18 |
| 2003/0147278 A1 | 8/2003 | Tanaka et al. | |
| 2004/0145947 A1 | 7/2004 | Micheloni et al. | |
| 2007/0171726 A1 | 7/2007 | Kang et al. | |
| 2007/0183210 A1 | 8/2007 | Choi et al. | |
| 2007/0195603 A1 | 8/2007 | Aritome et al. | |
| 2008/0117688 A1 | 5/2008 | Park et al. | |
| 2008/0159007 A1 | 7/2008 | Sekar et al. | |
| 2010/0074028 A1 | 3/2010 | Hirose et al. | |
| 2011/0182119 A1 | 7/2011 | Strasser et al. | |
| 2014/0029350 A1 | 1/2014 | Kim et al. | |

OTHER PUBLICATIONS

Office Action dated Apr. 8, 2014, from Mu et al., "Methods and Systems for Adjusting NVM Cell Bias Conditions for Read/Verify Operations to Compensate for Performance Degradation", U.S. Appl. No. 13/557,449, filed Jul. 25, 2012, 11 pgs.

Office Action dated Apr. 24, 2014, from Mu et al., "Methods and Systems for Adjusting NVM Cell Bias Conditions for Programs/Erase Operations to Reduce Performance Degradation", U.S. Appl. No. 13/557,629, filed Jul. 25, 2012, 19 pgs.

(Continued)

Primary Examiner — Vu Le
(74) Attorney, Agent, or Firm — Egan, Peterman & Enders LLP.

(57) ABSTRACT

Methods and systems are disclosed for making temperature-based adjustments to bias conditions for non-volatile memory (NVM) cells to improve performance and product lifetime of NVM systems. System embodiments include integrated NVM systems having an NVM controller, a bias voltage generator, and an NVM cell array. Further, the NVM systems can store temperature-based bias condition information in storage circuitry. The disclosed embodiments select and apply bias conditions for the NVM cells based upon temperature measurements.

12 Claims, 3 Drawing Sheets

(56) References Cited

OTHER PUBLICATIONS

Stephen Ledford, "Non-Volatile Memory Technology Overview," Freescale Semiconductor, AN1837, 2004, 28 pgs.
U.S. Appl. No. 13/169,989, "Adaptive Write Procedures for Non-Volatile Memory Using Verify Read," filed Jun. 27, 2011, 29 pgs.
Choy et al., U.S. Appl. No. 13/023,713, "Erase Ramp Pulse Width Control for Non-Volatile Memory," filed Feb. 9, 2011, 27 pgs.
Mu et al., "Methods and Systems for Adjusting NVM Cell Bias Conditions for Read/Verify Operations to Compensate for Performance Degradation", U.S. Appl. No. 13/557,449, filed Jul. 25, 2012, 25 pgs.
Mu et al., "Methods and Systems for Adjusting NVM Cell Bias Conditions for Program/Erase Operations to Reduce Performance Degradation", U.S. Appl. No. 13/557,629, filed Jul. 25, 2012, 30 pgs.
Foreign Search Report, Application No. 13177161.0, Nov. 18, 2013, 6 pgs.
European Search Report, Aug. 26, 2014, 13 pgs.
Notice of Allowance dated Sep. 1, 2014, for Mu et al., "Methods And Systems For Adjusting NVM Cell Bias Conditions For Program/Erase Operations To Reduce Performance Degradation", U.S. Appl. No. 13/557,629, filed Jul. 25, 2012, 9 pgs.

* cited by examiner

METHODS AND SYSTEMS FOR ADJUSTING NVM CELL BIAS CONDITIONS BASED UPON OPERATING TEMPERATURE TO REDUCE PERFORMANCE DEGRADATION

RELATED APPLICATIONS

This application is related in subject matter to the following concurrently filed applications: U.S. patent application Ser. No. 13/557,449, entitled "METHODS AND SYSTEMS FOR ADJUSTING NVM CELL BIAS CONDITIONS FOR READ/VERIFY OPERATIONS TO COMPENSATE FOR PERFORMANCE DEGRADATION," and U.S. patent application Ser. No. 13/557,629, entitled "METHODS AND SYSTEMS FOR ADJUSTING NVM CELL BIAS CONDITIONS FOR PROGRAM/ERASE OPERATIONS TO REDUCE PERFORMANCE DEGRADATION," and which are each hereby incorporated by reference in its entirety.

TECHNICAL FIELD

This technical field relates to non-volatile memories (NVMs) and, more particularly, to techniques for controlling memory operations for NVM cells.

BACKGROUND

Programmable memories have been implemented using non-volatile memory (NVM) cells. These NVM systems can be implemented as stand-alone memory integrated circuits or can be embedded within other integrated circuits. NVM systems have utilized a variety of cell structures for NVM cells, including floating gate cells and split-gate cells. Further, a variety of techniques have been used to perform read, program, and erase operations for NVM cells, including Fowler-Nordheim (FN) tunneling techniques. The performance of NVM cells can degrade, however, due to a variety of factors.

Cycling performance for NVM cells, for example, is temperature dependent. In particular, the speed of program operations is slower at higher temperature than that at lower temperature. Fowler-Nordheim (FN) tunneling erase operations are faster at high temperature than that at lower temperature. These temperature variations are natural behaviors based on physical properties. These temperature dependent behaviors can lead to performance degradation. For example, a voltage ramp is often used in FN erase and soft-program operations. For the slow erase operations at lower temperatures, the time needed for the erase operation can run over the voltage ramp timing, thereby leading to dramatically degraded cycling performance.

Cycling performance for NVM cells will also degrade dramatically after a certain number of cycles because of the accumulation of the damage due to cycling. For example, for NVM cells that utilize floating gates and tunneling oxides, more and more charges (e.g., holes and electrons) are trapped within tunnel oxide as cycle count increases, thereby damaging the tunnel oxide. This damage not only degrades cycling performance, but it also degrades other reliability aspects for the NVM cells due to large de-trapping effects. Some of these reliability aspects include data retention bake (DRB) reliability, operating life (OL), program disturb, read disturb, and other reliability aspects for the NVM cells.

Performance degradations for the NVM cells, such as performance degradations due to temperature variations or high cycle counts, can reduce the useful lifetime for the NVM systems and integrated circuits within which these NVM systems are embedded.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale

DETAILED DESCRIPTION

Methods and systems are disclosed for adjusting bias conditions for non-volatile memory (NVM) cells to improve performance and product lifetime of NVM systems. In particular, embodiments are disclosed for adjusting NVM cell bias conditions based upon temperature measurements. The disclosed embodiments maintain high performance even as performance degradation occurs, for example, due to operating temperature variations, thereby improving product reliability and extending product lifetime. The various embodiments disclosed can be used alone or in combination with each other, as desired. Further, additional or different features and variations can be implemented, as desired, and related or modified systems and methods can be utilized, as well.

Figure 1:
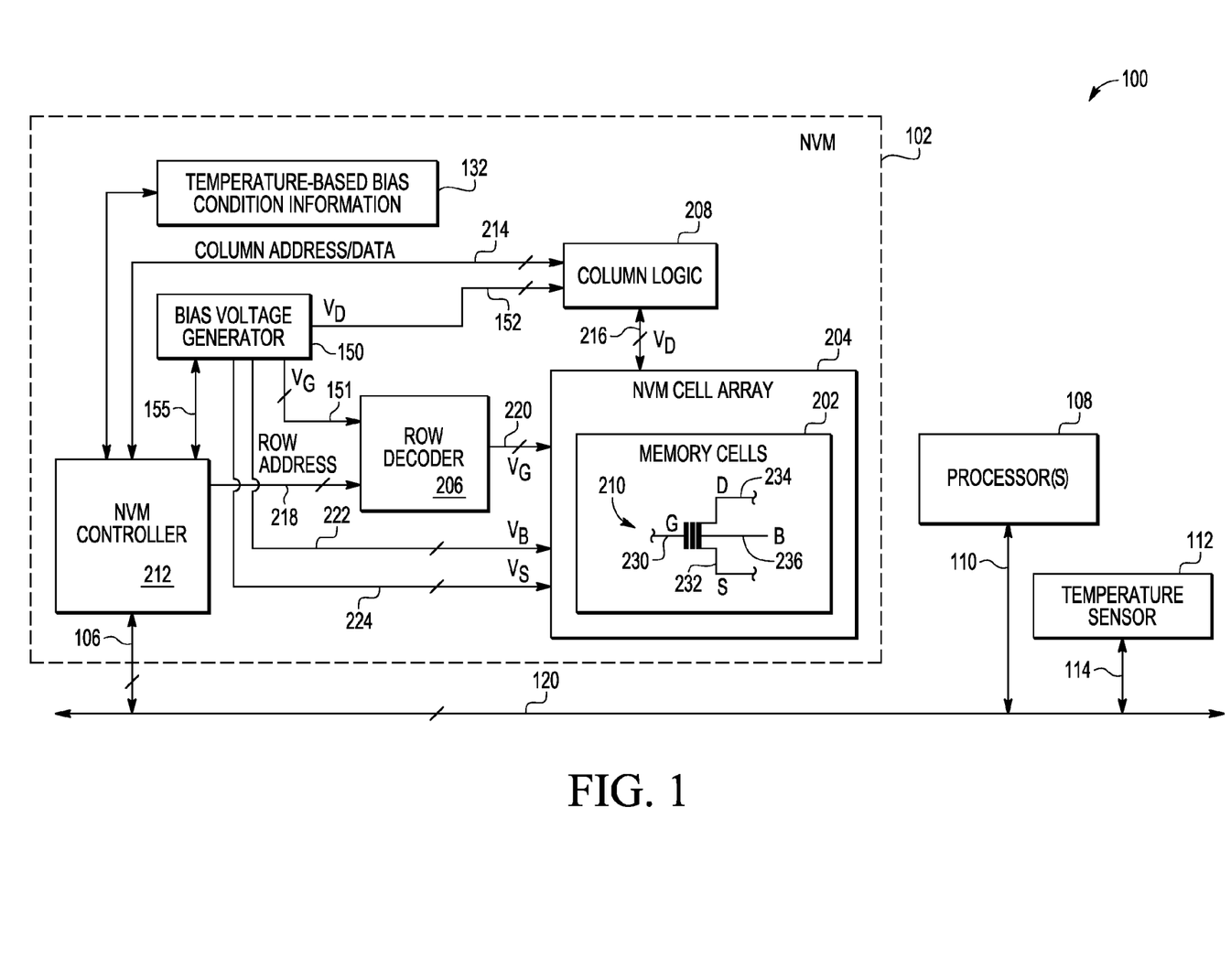
FIG. 1 is a block diagram of an embodiment including an non-volatile memory (NVM) system.
Figure 3:
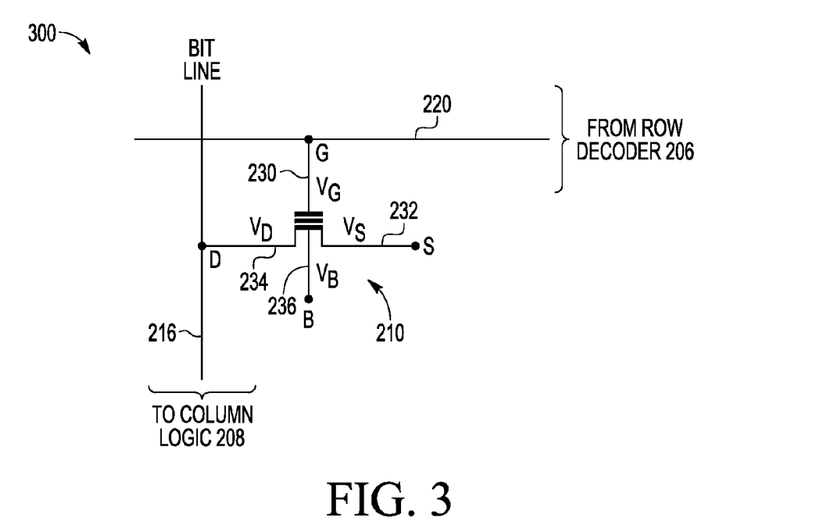
FIG. 3 is a diagram for wordline and bit-line connections to an NVM memory cell.

First, looking to FIGS. 1 and 3, example memory system embodiments are described that adjust bias conditions for NVM cells based upon operating temperature. In particular, these embodiments use current operating temperature information and stored temperature-based bias condition information to implement adjustments to NVM cell bias conditions for memory operations in order to improve performance and product lifetime of NVM systems.

FIG. 1 is a block diagram of an embodiment 100 including a non-volatile memory (NVM) 102 along with additional circuitry, such as one or more processors 108 and a temperature sensor 112. The NVM system 102 is configured to store operational data that is utilized in operating the NVM system 102. For example, for the embodiment 100 depicted, the NVM system 102 includes temperature-based bias condition information 132 that can be used for memory operations within the NVM system 102, as described in further detail below. This temperature-based bias condition information 132 can be stored within storage circuitry located within the NVM system 102, and this storage circuitry can be, for example, random access memory (RAM), read-only memory (ROM), programmable non-volatile memory (NVM), or other desired storage circuitry. Still further, for the embodiment 100 depicted, the NVM system 102 and the processor(s) 108 are coupled to a communication bus 120 through connections 106 and 110, respectively. Additional circuitry blocks can also be included within the embodiment 100, as desired. For example, an on-chip temperature sensor 112 can be provided, and the temperature sensor 112 can be coupled to communication bus 120 through connections 114. The temperature sensor 112 can generate temperature measurements corresponding to the operating temperature for the NVM system 102. These temperature measurements can be accessed by or communicated to the processor(s) 108, the NVM system 102, and/or other circuitry, as desired. It is noted that the NVM system 102 can be integrated within a single integrated circuit with the one or more processors 108 or can be implemented as stand-alone memory integrated circuit, if desired. Further, it is noted that the temperature sensor 112 could be integrated with the NVM system 102 or could be integrated within another integrated circuit, if desired. Still further, it is noted that the circuitry for the NVM system 102 could be implemented using multiple integrated circuits, if desired.

The NVM system 102 includes an array 204 of NVM cells 202. The NVM system 102 also includes an NVM controller 212, a row decoder 206 and column decoder logic 208. As indicated above, the NVM system 102 is configured to store operational data, such as temperature-based bias condition information 132, that can be used for one or more operations of the NVM system 102. Memory cell 210 represents one of the plurality of NVM memory cells 202. For the embodiment depicted, memory cell 210 is a floating-gate type NVM memory cell having a gate (G) connection 230, a source (S) connection 232, a drain (D) connection 234 and a body (B) connection 236. It is noted that other NVM cell types could also be utilized, if desired. For example, split-gate NVM cells or multi-level NVM cells could be used, or other NVM cells could be used, if desired.

The stored temperature-based bias condition information 132, as described herein, is used to provide different sets of selectable bias condition parameters for operating the NVM system 102. These sets of selectable bias condition parameters can include, for example, default bias conditions and one or more additional sets of bias conditions that can be selected based upon operating conditions, such as after detection of degraded performance or some other condition or parameter, as desired.

During operation, the NVM controller 212 provides row addresses to the row decoder 206 through connection 218. The row decoder 206 drives selected wordlines with gate bias voltages ($V_G$) 220 applied to gate nodes 230 for selected row(s) of NVM cells 202 within the NVM cell array 204. The NVM controller 212 also provides column addresses to column logic 208 through connections 214. The column logic 208 drives selected bit-lines with drain bias voltages ($V_D$) 216 applied to drain nodes 234 for selected column(s) of NVM cells 202. The column logic 208 is also used to access and read stored data values from the selected NVM cells 202 within the NVM cell array 204 through connections 216.

A bias voltage generator 150 is configured to generate a variety of bias voltages that are used for the operation of the NVM system 102. For example, the bias voltage generator 150 provides gate bias voltages 151 to row decoder 206 that are used to apply the gate bias voltages ($V_G$) 220 to the NVM cells 202 within the NVM cell array 204. The bias voltage generator 150 also provides drain bias voltages 152 to column logic 208 that are used to apply the drain bias voltages ($V_D$) 216 to the NVM cells 202 within the NVM cell array 204. Further, the bias voltage generator 150 provides body bias voltages ($V_B$) 222 to body nodes 236 for the NVM cells 202 within the NVM cell array 204, and the bias voltage generator 150 provides source bias voltages ($V_S$) 224 to source nodes 232 for the NVM cells 202 within the NVM cell array 204. The bias voltage generator 150 receives bias control signals 155 from the NVM controller 212 that control which bias voltages are provided by the bias voltage generator and used by the row decoder 206, the column logic 208 and the NVM cell array 204. It is further noted that the bias voltage generator 150 can be implemented as bias voltage generator circuitry that is distributed in different locations throughout the NVM system 102, if desired. For example, where the NVM system 102 is integrated within an integrated circuit, the bias voltage generator circuitry can be implemented as different circuit blocks positioned in different locations within the integrated circuit, and the different circuit blocks can be configured to generate one or more of the bias voltages. Further, if desired, the bias voltage generator circuitry can be implemented as a single, non-distributed circuit block. Other variations could also be implemented as desired while still provide the bias voltages described herein.

As indicated above, the NVM system 102 is configured to perform one or more operations, such as a read operation, an erase operation, a program operation, a soft-program operation, an erase verify operation, a program verify operation, a soft-program verify operation and/or any other desired operation. Typically, when put into operation after manufacture, an erase operation is first performed to clear any information stored within the NVM system 102. Following an erase operation, a soft-program operation can be used to make sure that the erased NVM cells are not excessively depleted. Next, a program operation is performed to access selected NVM cells and to write desired data into the NVM system 102. Subsequently, read operations are used to access the data stored within the NVM system 102. If it is desired to modify the data stored in the NVM system 102, additional erase and program operations can be used to modify the data within the NVM system 102. Program/erase cycling and read operations are often continued throughout the useful life of the NVM system 102.

For a read operation, the data from the accessed NVM cells 202 is read by the column logic 208 and transmitted back to the NVM controller 212 through connections 214. The NVM controller 212 can then provide this read data to external circuitry through connections 106. For a program operation, the accessed memory cells are programmed with data provided by the NVM controller 212, which can in turn be provided from external circuitry through the connections 106. For an erase operation, the threshold voltage of the accessed memory cells is reduced to below a desired threshold (i.e., erase verify level) after the erase operation. For a soft-program operation, as indicated above, the threshold voltage of the accessed memory cells is increased to above a desired threshold (i.e., soft program verify level) after the soft program operation. Verify operations (e.g., erase verify, program verify, soft-program verify) are a type of read operation where the stored charge within NVM cells is interrogated by accessing the cells and compared against selected threshold voltages or currents.

It is further noted that for program and erase operations, charge is added to or removed from charge storage layers within the NVM cells 202. These charge storage layers can be, for example, floating gates or discrete charge layers within the NVM cells 202. More particularly, when an NVM cell 202 is programmed, electrons are added to the charge storage layer (e.g., thereby generating a higher threshold voltage when read). When the NVM cell 202 is erased, electrons are removed from the charge storage layer (e.g., thereby generating a lower threshold voltage when read). If desired, the NVM system 102 can be configured to operate with a weaker erase, such that after erase, a small negative charge is still left in the charge storage layer. Also, the NVM system 102 may be configured to have a very strong erase, such that the charge storage layer is over-erased, generating net holes within the storage layer and thereby providing a positive charge within the erased cell. When an NVM cell 202 is later accessed during a read operation, a determination is made as to whether the threshold voltage of the cell is greater than a read voltage level (e.g., logic "0") or less than a read voltage level (e.g., logic "1"). It is also noted that where multi-level NVM cells are utilized within the NVM system, a determination is made as to what logic values the threshold voltage of the cell represents. For example, for a four level cell, the detected logic levels are "00," "01," "10," and "11" with a single cell storing two bits of information.

It is again noted that NVM system 102 is typically configured to perform one or more operations, such as a read operation, an erase operation, a program operation, a soft-program operation, an erase verify operation, a program verify operation, a soft-program verify operation, and/or any other desired operation. During these operations, bias conditions are applied to the NVM cells 202 within the NVM system 102, and these bias conditions depend upon the NVM operation being performed.

FIG. 3 is a diagram of an embodiment 300 for wordline and bit-line connections to an NVM memory cell 210. During an operation, the NVM memory cell 210 has its body (B) 236 connected to a body bias voltage ($V_B$) and has its source (S) 232 connect to a source bias voltage ($V_S$), for example, as provided by the bias voltage generator 150 as described above. The NVM cell 210 has its drain (D) 234 coupled to the column logic 208 through one of the connections 216 to receive a drain bias voltage ($V_D$). The NVM cell 210 has its gate (G) 230 coupled to the row decoder 206 through one of the connections 220 to receive a gate bias voltage ($V_G$). Depending upon the operation to be performed for the NVM memory cells 202, different body, source, drain, and gate bias voltages ($V_B$, $V_S$, $V_D$, $V_G$) are applied to the body (B) nodes 236, source (S) nodes 232, drain (D) nodes 234, and gate (G) nodes 230 for selected NVM memory cells 202.

TABLE 1 below provides example default bias conditions that can be used for program operations, erase operations, and soft-program operations for the NVM system 102. TABLE 1 also provides example default bias conditions that can be used for program verify operations, erase verify operations, and soft-program verify operations for the NVM system 102. TABLE 1 also provides example bias voltage adjustments that can be made for different NVM operations based on operating temperature variations. It is noted that other bias conditions in addition to or instead of those indicated below could also be adjusted, if desired. For example, the gate node voltage ($V_G$), the drain node bias voltage ($V_D$), the source node bias voltage ($V_S$), the body node bias voltage ($V_B$) or any combination thereof could be adjusted to improve performance due to operating temperature variations for the NVM system 102.

TABLE 1

EXAMPLE DEFAULT BIAS CONDITIONS AND TEMPERATURE-BASED BIAS CONDITION ADJUSTMENTS

| Operation | $V_D$ (volts) | $V_G$ (volts) | $V_S$ (volts) | $V_B$ (volts) | Bias Voltage Adjustments Based Upon Temperature |
|---|---|---|---|---|---|
| Program | 4.5 | 8.5 | GND | GND | ±500 milli-volts for $V_G$ |
| Erase | float | −8.5 | float | 8.5 | ±500 milli-volts for $V_B$ |
| Soft-program | 4.5 | 2.5 | GND | GND | ±500 milli-volts for $V_G$ |

With respect to TABLE 1, it is noted that "±500 milli-volts" refers to an adjustment that can be in a range from zero to positive 500 milli-volts or from zero to negative 500 milli-volts, as desired. The magnitude and sign of a particular adjustment value can be selected, as desired, and different adjustments can be selected for different sets of bias conditions. It is also noted the "float" indicates nodes that are allowed to float during operation, such that they are not tied to a particular voltage level. It is further noted that ground (GND), as set forth in the table below, can be configured to be zero volts.

Figure 4:
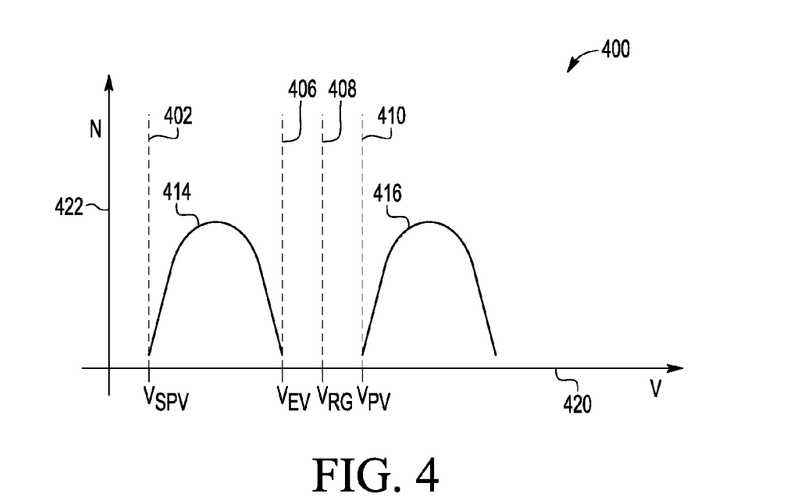
FIG. 4 is a probability distribution diagram for threshold voltages of the NVM cells with respect to programming and erase operations.

Performance degradation affects for the NVM cells 202 within the NVM system 102 are now discussed in more detail with respect to FIG. 4.

FIG. 4 is a probability distribution diagram 400 for the gate or threshold voltages of the NVM cells with respect to programming and erase operations. The x-axis 420 represents threshold voltage, and the y-axis 422 represents a probability distribution (N) of threshold voltage levels for NVM cells 202 within the NVM cell array 204. The voltage level 408 represents a read gate bias voltage ($V_{RG}$) applied during read operations. With respect to verification operations, the voltage level 402 represents a soft-program verify voltage ($V_{SPV}$) used during soft-program verification operations. The voltage level 406 represents an erase verify bias voltage ($V_{EV}$) used during erase verification operations. The voltage level 410 represents a program verify bias voltage ($V_{PV}$) used during program verification operations. Curve 414 represents a probability distribution for threshold voltages of erased cells within the NVM cell array 204. Curve 416 represents a probability curve for threshold voltages of programmed cells within the NVM cell array 204. For read operations, if the threshold voltage level of the accessed cell is above the read gate bias voltage ($V_{RG}$) 408, the NVM cell is determined to be programmed (e.g., logic 0). If the threshold voltage level of the accessed cell is below the read gate bias voltage ($V_{RG}$) 408, the NVM cell is determined to be erased (e.g., logic 1).

It is noted that FIG. 4 illustrates an example where two-level memory cells are utilized. Multi-level cells (MLCs) could also be used, such that there would be four or more distribution curves, depending upon the number of voltage levels utilized.

According to the embodiments described herein, it is recognized that operating temperature can affect the voltage probability distribution curves for the NVM cells. For example, it is noted that the higher the operating temperature for the NVM cells, the faster an erase will occur and the slower a program and a soft-program will occur. Further, after a given number of program pulses at a given operating temperature, the threshold levels of the memory cells of the array will tend to be higher for low operating temperatures than those for high operating temperatures. Further, after given number of erase pulses at a given operating temperature, the threshold levels of the memory cells of the array will tend to be higher for low operating temperatures than those for high operating temperatures.

Advantageously, the embodiments described herein provide for adjustments to the operating bias conditions for the NVM cells 202 to reduce performance degradations that would otherwise occur, for example, from temperature variations during operation of the NVM cells 202.

Figure 2:
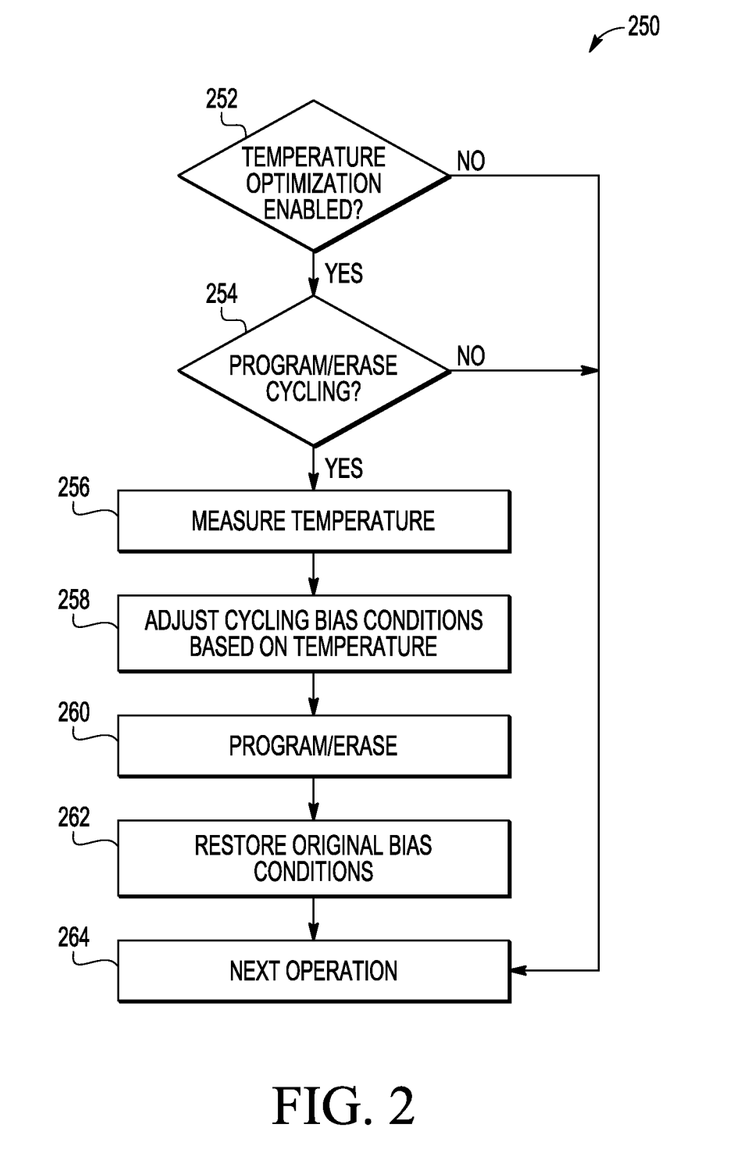
FIG. 2 is a flow diagram of an embodiment for adjusting bias conditions for the NVM system based upon temperature measurements.

FIG. 2 provides a flow diagram of an embodiment 250 for adjusting program and/or erase bias voltage conditions based upon operating temperature measurements. By dynamically adjusting bias conditions based on operating temperature, cycle performance for the NVM cells is improved over a wide range of operating temperatures. With respect to TABLES 2-3 below, it is further noted that other bias conditions in addition to or instead of those indicated below could also be adjusted, if desired. For example, the gate node voltage ($V_G$), the drain node bias voltage ($V_D$), the source node bias voltage ($V_S$), the body node bias voltage ($V_B$) or any combination thereof could be adjusted to improve performance due to operating temperature variations for the NVM system 102.

For the embodiment 250 depicted, a determination is made in block 252 whether or not the NVM system 102 has been placed in a temperature optimization mode, in which adjustments are made to bias conditions based upon on-chip operating temperature. If NO, then flow passes to block 264, where the next operation is performed for the NVM system 102. If YES, then flow passes to block 254, where a determination is made whether or not program/erase cycling will be performed. If NO, then flow passes to block 264, where the next operation is performed for the NVM system 102. If YES, then flow passes to block 256 where an on-chip temperature is checked for the NVM system 102, for example, using an on-chip temperature sensor 112. In block 258, the program/erase cycling bias conditions are adjusted based upon the temperature measurement. After these adjustments are made to bias conditions, program and erase cycling operations can then be performed in block 260 using the adjusted bias conditions. In block 262, the original bias conditions are restored. Finally, block 264 is reached where the next operation is performed for the NVM system 102.

TABLE 2 below provides example adjustments that can be used to adjust the operating conditions for program and soft-program operations based upon the temperature measurement being higher than a selected high level temperature threshold value. For example, temperature-based bias conditions can be stored as bias condition information 132 within the NVM system 102 and used to provide program and soft-program bias conditions corresponding to measured operating temperatures. These temperature-based bias conditions, for example, can be stored in the form of a look-up table, if desired, that identifies bias conditions or parameters to use depending upon the on-chip temperature measurement. Further, this data can be updated, stored, and restored, as desired.

TABLE 2

EXAMPLE PROGRAM BIAS CONDITION ADJUSTMENTS
FOR TEMPERATURE ABOVE HIGH THRESHOLD TEMPERATURE
($T > T_{HIGH}$)

| Operation | Operating T | $V_D$ (volts) | $V_G$ (volts) | $V_S$ (volts) | $V_B$ (volts) |
|---|---|---|---|---|---|
| Program | $T > T_{HIGH}$ | 4.5 | 8.5 plus increase up to 500 milli-volts | GND | GND |
| Soft-program | $T > T_{HIGH}$ | 4.5 | 2.6 plus increase up to 500 milli-volts | GND | GND |

TABLE 3 below provides example adjustments that can be used to adjust the operating conditions for erase operations based upon the temperature measurement being lower than a selected low level temperature threshold value. For example, temperature-based bias conditions can be stored as bias condition information 132 within the NVM system 102 and used to provide program and soft-program bias conditions corresponding to measured operating temperatures. These temperature-based bias conditions, for example, can be stored in the form of a look-up table, if desired, that identifies bias conditions or parameters to use depending upon the on-chip temperature measurement. Further, this data can be updated, stored, and restored, as desired.

TABLE 3

EXAMPLE ERASE BIAS CONDITION ADJUSTMENTS
FOR TEMPERATURE BELOW LOW THRESHOLD TEMPERATURE
($T < T_{LOW}$)

| Operation | Operating T | $V_D$ (volts) | $V_G$ (volts) | $V_S$ (volts) | $V_B$ (volts) |
|---|---|---|---|---|---|
| Erase | $T < T_{LOW}$ | float | −8.5 | float | 8.5 plus increase up to 500 milli-volts |

As shown in embodiment 500 and described in TABLES 2-3, therefore, the operating temperature is checked before program/erase cycling using a temperature sensor measurement. Operating voltage bias conditions are then adjusted based upon the operating temperature measurement to achieve improved program/erase cycling performance. For example, program and soft-program bias voltages can be increased for temperature measurements above a high threshold temperature ($T_{HIGH}$), and erase bias voltages can be increased for temperature measurements below a low threshold temperature ($T_{LOW}$). These increases cause the programming speed for high temperature to be boosted and cause the erase speed for low temperature to be boosted. As such, the NVM cells can be configured to maintain a consistent high performance level across different operating temperatures.

Further, it is noted that the high and low threshold temperature values can be selected, as desired. Other variations could also be implemented as desired. For example, a plurality of high temperature threshold values could be utilized along with different bias voltage adjustments associated with each temperature level. Similarly, a plurality of low temperature threshold values could be utilized along with different bias voltage adjustments associated with each temperature level. As such, the operating temperature measurement can be used to make a number of bias voltage adjustments as the operating temperature of the NVM system moves higher and lower during operation. TABLE 4 below provides an example where multiple different threshold voltage levels are utilized.

TABLE 4

EXAMPLE BIAS CONDITION ADJUSTMENTS
FOR MULTIPLE TEMPERATURE THRESHOLDS

| Operation | Operating T | $V_D$ (volts) | $V_G$ (volts) | $V_S$ (volts) | $V_B$ (volts) |
|---|---|---|---|---|---|
| Program | $T > T_{P2}$ | 4.5 | 9.0 | GND | GND |
| Program | $T < T_{P2}$ $T > T_{P1}$ | 4.5 | 8.75 | GND | GND |
| Program | $T < T_{P1}$ | 4.5 | 8.5 (default) | GND | GND |
| Soft-Program | $T > T_{SP2}$ | 4.5 | 3.1 | GND | GND |
| Soft-Program | $T < T_{SP2}$ $T > T_{SP1}$ | 4.5 | 2.85 | GND | GND |
| Soft-Program | $T < T_{SP1}$ | 4.5 | 2.6 (default) | GND | GND |
| Erase | $T < T_{E1}$ | float | −8.5 | float | 9.0 |
| Erase | $T > T_{E1}$ $T < T_{E2}$ | float | −8.5 | float | 8.75 |
| Erase | $T > T_{E2}$ | float | −8.5 | float | 8.5 (default) |

As indicated herein, a variety of embodiments can be implemented and different features and variations can be implemented, as desired.

In one system embodiment, an integrated non-volatile memory (NVM) system includes an array of non-volatile memory (NVM) cells, bias voltage generator circuitry configured to generate bias voltages for the NVM cells, and controller circuitry. The controller circuitry is configured to obtain an operating temperature measurement relating to the NVM system, to determine performance degradation for the NVM system based upon the temperature measurement, and to adjust at least one voltage level for the bias voltages generated by the bias voltage generator circuitry based upon the performance degradation determination. The controller circuitry is further configured to conduct a memory operation for the NVM system using the adjusted at least one voltage level.

In further system embodiments, the memory operation is a program operation. Still further, the at least one voltage level can include a voltage level for a gate bias voltage that is adjusted higher than a default gate bias voltage level if the operating temperature measurement is higher than a threshold operating temperature. In addition, the voltage level for the gate bias voltage can be adjusted higher by an amount less than or equal to 500 milli-volts. Further, the program operation can be a soft-program operation.

In additional system embodiments, the memory operation is an erase operation. Still further, the at least one voltage level can include a voltage level for a body bias voltage that is adjusted higher than a default body bias voltage level if the operating temperature measurement is lower than a threshold operating temperature. In addition, the voltage level for the body bias voltage is adjusted higher by an amount less than or equal to 500 milli-volts.

In additional system embodiments, the controller circuitry can be further configured to reset the at least one adjusted voltage level to a default level after the memory operation. Still further, the controller circuitry can be further configured to store information representing the at least one adjusted voltage level after the memory operation. In addition, the bias voltage generator circuitry can be at least two circuit blocks positioned in different locations on the integrated NVM system.

In one method embodiment, a method for operating an integrated non-volatile memory (NVM) system includes obtaining an operating temperature measurement relating to an array of non-volatile memory (NVM) cells within an NVM system, determining performance degradation based upon the operating temperature measurement, adjusting at least one bias voltage generated by a bias voltage generator for the NVM cells based upon the performance degradation determination, and performing at least one memory operation for the NVM system using the adjusted at least one bias voltage.

In further method embodiments, the performing step is performing a program operation. Still further, the adjusting step can include increasing a voltage level for a gate bias voltage if the operating temperature measurement is higher than a threshold operating temperature. In addition, the adjusting step can include increasing the voltage level for the gate bias voltage by an amount less than or equal to 500 milli-volts.

In additional method embodiments, the performing step is performing an erase operation. Still further, the adjusting step can include increasing a voltage level for a body bias voltage if the operating temperature measurement is lower than a threshold operating temperature. In addition, the adjusting step can include increasing the voltage level for the body bias voltage by an amount less than or equal to 500 milli-volts.

In still further method embodiments, the method can further include resetting the at least one adjusted bias voltage to a default voltage level after the performing step. Still further, the method can further include determining if temperature-based adjustments have been enabled prior to performing the obtaining, determining, adjusting, and performing steps.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. An integrated non-volatile memory (NVM) system, comprising:
    an array of non-volatile memory (NVM) cells;
    bias voltage generator circuitry configured to generate bias voltages for the NVM cells; and
    controller circuitry configured to obtain operating temperature measurements relating to the NVM system, to determine performance degradation for the NVM system based upon the temperature measurements, and to adjust voltage levels for the bias voltages generated by the bias voltage generator circuitry based upon the performance degradation determination;
    wherein the controller circuitry is further configured to conduct program and erase operations for the NVM system using the adjusted voltage levels;
    wherein for a program operation a voltage level for a gate bias voltage is adjusted higher than a default gate bias voltage level if an operating temperature measurement is higher than a threshold operating temperature; and
    wherein for an erase operation a voltage level for a body bias voltage that is adjusted higher than a default body bias voltage level if an operating temperature measurement is lower than a threshold operating temperature.

2. The integrated NVM system of claim 1, wherein the voltage level for the gate bias voltage is adjusted higher by an amount less than or equal to 500 milli-volts.

3. The integrated NVM system of claim 1, wherein the program operation comprises a soft-program operation.

4. The integrated NVM system of claim 1, wherein the voltage level for the body bias voltage is adjusted higher by an amount less than or equal to 500 milli-volts.

5. The integrated NVM system of claim 1, wherein the controller circuitry is further configured to reset the voltage levels to default levels after the program and erase operations.

6. The integrated NVM system of claim 1, wherein the controller circuitry is further configured to store information representing the at least one adjusted voltage level after the program and erase operations.

7. The integrated NVM system of claim 1, wherein the bias voltage generator circuitry comprises at least two circuit blocks positioned in different locations on the integrated NVM system.

8. A method for operating an integrated non-volatile memory (NVM) system, comprising:
- obtaining operating temperature measurements relating to an array of non-volatile memory (NVM) cells within an NVM system;
- determining performance degradation based upon the operating temperature measurements;
- for a program operation, increasing a voltage level for a gate bias voltage generated by a bias voltage generator for the NVM cells based upon the performance degradation determination if an operating temperature measurement is higher than a threshold operating temperature;
- performing a program operation for the NVM system using the adjusted gate bias voltage;
- for an erase operation, increasing a voltage level for a body bias voltage generated by a bias voltage generator for the NVM cells based upon the performance degradation determination if an operating temperature measurement is lower than a threshold operating temperature; and
- performing an erase operation for the NVM system using the adjusted body bias voltage.

9. The method of claim 8, wherein the voltage level for the gate bias voltage is increased by an amount less than or equal to 500 milli-volts.

10. The method of claim 8, wherein the voltage level for the body bias voltage is increased by an amount less than or equal to 500 milli-volts.

11. The method of claim 8, further comprising resetting the adjusted bias voltages to default voltage levels after the performing steps.

12. The method of claim 8, further comprising determining if temperature-based adjustments have been enabled prior to performing the obtaining, determining, increasing, and performing steps.

* * * * *